United States Patent [19]

Shimizu

[11] 4,364,036
[45] Dec. 14, 1982

[54] COMPOSITE LOGIC ANALYZER CAPABLE OF DATA DISPLAY IN TWO TIME-RELATED FORMATS

[75] Inventor: Kazunari Shimizu, Musashino, Japan

[73] Assignee: Iwatsu Electric Co., Ltd., Tokyo, Japan

[21] Appl. No.: 209,488

[22] Filed: Nov. 24, 1980

[30] Foreign Application Priority Data

Nov. 26, 1979 [JP] Japan ............................... 54-152600

[51] Int. Cl.³ ............................................... G09G 1/08
[52] U.S. Cl. ............................. 340/715; 324/73 AT; 324/121 R; 340/720; 340/721; 340/722; 340/799; 364/900
[58] Field of Search ............... 340/715, 706, 721, 722, 340/747, 720; 324/73 AT, 73 R, 121 R; 364/200, 900

[56] References Cited

U.S. PATENT DOCUMENTS

| | | | |
|---|---|---|---|
| 3,179,883 | 4/1965 | Farrow | 340/720 X |
| 3,872,461 | 3/1975 | Jarosik et al. | 340/715 4n |
| 4,099,668 | 7/1978 | Feilchenfeld et al. | 324/73 AT |
| 4,139,818 | 2/1979 | Schneider | 324/73 R |
| 4,139,903 | 2/1979 | Morrill et al. | 324/121 R |
| 4,257,043 | 3/1981 | Tsuchiko | 340/722 |

*Primary Examiner*—David L. Trafton
*Attorney, Agent, or Firm*—Woodcock, Washburn, Kurtz, Mackiewicz & Norris

[57] ABSTRACT

A combined logic timing and state analyzer comprises an internally clocked, timing analyzer section receiving a first set of logic signals, and an externally clocked, state analyzer section receiving a second set of logic signals. The timing analyzer section samples the first set of logic signals, as well as the external clock signal associated with the second set of logic signals, at a rate determined by the internal clock pulses and stores the samples in a first set of memories. The state analyzer section samples the second set of logic signals at a rate determined by the external clock pulses and stores the samples in a second set of memories. Data introduction into the memories terminates when they are triggered, as in the event of a malfunction of the system being investigated. The logic analyzer further includes a display circuit for repetitively reading out the first and the second sets of memories and for causing a display device to visually present the output data of the first memory set in the form of a timing diagram and the output data of the second memory set in the form of a state table. The time relationship between the two display formats can be readily ascertained since the timing diagram includes a waveform, or other visual representations, indicative of the external clock pulses used for sampling the second set of logic signals.

9 Claims, 9 Drawing Figures

COMPOSITE LOGIC ANALYZER CAPABLE OF DATA DISPLAY IN TWO TIME-RELATED FORMATS

BACKGROUND OF THE INVENTION

My invention relates to instruments, known to the specialists as logic analyzers, for visual presentation of logic signals, and more specifically to a composite logic analyzer capable of simultaneously (or independently) displaying two sets of logic signals in different, time-related formats. My invention will be disclosed herein as adapted for a combined logic state and timing analyzer, exhibiting data in the state-table and/or timing-diagram format, but with no unnecessary limitations thereto being intended.

Logic analyzers have been classified as either timing analyzers or state analyzers. The logic timing analyzer might be described as a multichannel digital-storage oscilloscope, normally with four to 16 input terminals for the reception of, for example, control signals from computer logic circuitry. Usually, the timing analyzer has an internal clock capable of generating a plurality of periodic signals at high recurrence rates. Any selected one of the clock signals is used for sampling the incoming control signals, and the captured samples are stored in random-access semiconductor memories as logic signals. Also included is a display circuit which reads out the memories repetitively and recreates the input signals as two-level waveforms, for display on a cathode-ray tube (CRT) in the timing diagram format.

From the displayed timing diagram the viewer can evaluate the timing relationships between the logic level changes, the presence or absence of pulses, the pulse durations, and other events of interest. Further the timing analyzer is normally constructed to detect glitches or spurious narrow pulses appearing between the clock pulses.

The logic state analyzer, on the other hand, may have 16 to 32 input terminals for connection, for example, to the data or address bus of the computer's central processing unit (CPU). The state analyzer is externally clocked, inputting the reference clock signal of the data or address bus signals. For this reason the sampling and storage of the data in the state analyzer proceed at a lower rate than in the timing analyzer. The state analyzer displays the captured bus data in the form of a state table, which contains successive sets of numerals or alphanumerics representing the data in binary, octal, or hexadecimal notation for the ease of interpretation. The state table enables the observer to ascertain the varying states of the bus.

Although intended for different purposes as above, the timing analyzer and the state analyzer are alike in basic configuration. The logic analyzer has been suggested, therefore, which can be switched between state analysis and timing analysis mode. This known instrument permits data display only in the state table or timing diagram format.

A more advanced composite logic analyzer has been developed wherein a complete state analyzer and a complete timing analyzer are unitized, only with a trigger generator shared by both analyzer sections, for simultaneous (or selective) display of a timing diagram and a state table on a common CRT screen. This advanced logic state and timing analyzer has its own drawback, however. The drawback arises from the fact that its state analyzer section is externally clocked, whereas the timing analyzer section is internally clocked. The repetition frequencies of the external and internal clock signals differ. Thus, except for the common moment of triggering, no time relationship can be ascertained between the data captured in the state analyzer section and displayed in the state table format and the data captured in the timing analyzer section and displayed on the same screen in the timing diagram format.

SUMMARY OF THE INVENTION

My invention seeks to correlate, in terms of time, the data displayed in two different formats by composite logic analyzers of the type under consideration. In attaining this objective, moreover, my invention seeks to make as much use as possible of the parts existing in the known logic analyzers and hence to make possible the economical manufacture of the improved composite logic analyzer.

Briefly, the composite logic analyzer according to my invention comprises a first analyzer section, as for timing analysis, to which are input a first set of logic signals, and a second analyzer section, as for state analysis, to which are input a second set of logic signals as well as an external clock signal associated therewith. The first analyzer section comprises sampler means for sampling the first set of logic signals and the external clock signal at a rate determined by an internal clock signal, and memory means for storing the samples of the first set of logic signals and of the external clock signal under the control of the internal clock signal. The second analyzer section likewise comprises sampler means for sampling the second set of logic signals, but at a rate determined by the external clock signal, and memory means for storing the samples of the second set of logic signals under the control of the external clock signal. Both first and second analyzer sections share trigger means for triggering their memory means and thus for suspending the introduction of the samples therein.

Connected downstream of the memory means of the first and the second analyzer sections is a display circuit which, when the memory means of the first analyzer section are triggered, repetitively reads out the memory means and produces a first set of display signals for displaying the recovered data in a first format. Also, when the memory means of the second analyzer section are triggered, the display circuit repetitively reads out the memory means and produces a second set of display signals for displaying the recovered data in a second format. A display device, normally a CRT, responds to the two sets of display signals from the display circuit to make visual presentation of the desired data in the first and the second display formats.

Such being the general organization of the improved composite logic analyzer according to my invention, it will have been seen that the external clock signal associated with the second set of logic signals is utilized for establishing time relationship between the data sets displayed in different formats. For this purpose, as has been stated, the external clock signal is sampled at the recurrence rate of the internal clock signal, and the samples are written into the memory means of the first analyzer section under the control of the internal clock signal. This internal clock signal is also used for sampling the first set of logic signals and for controlling the introduction of their samples into the memory means.

In a preferred embodiment the first analyzer section is used for displaying the first set of logic signals as two-level waveforms, and the second analyzer section for displaying the second set of logic signals as hexadecimal-coded sets of alphanumerics, on the same CRT screen. The waveforms of the first set of logic signals are displayed together with the waveform of the external clock signal in accordance with my invention. Since the displayed external clock pulses correspond in time to the respective displayed sets of alphanumerics, the former serve as visual indications of the time relationship between the waveforms of the first set of logic signals and the alphanumeric representations of the second set of logic signals.

The above and other objects, features and advantages of my invention and the manner of attaining them will become more apparent, and the invention itself will best be understood, from a study of the following description of some preferred embodiments, with reference had to the attached drawings.

DESCRIPTION OF THE PREFERRED EMBODIMENTS

Figure 1:
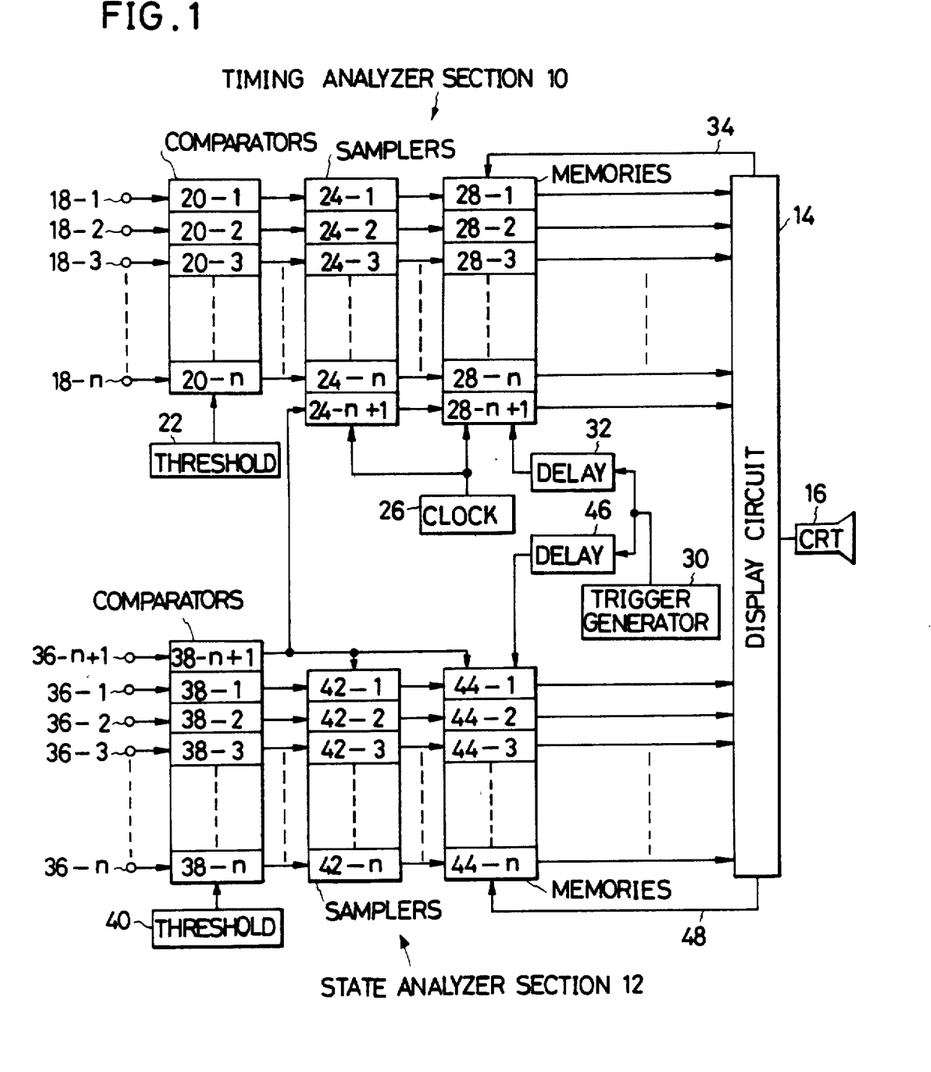
FIG. 1 is a block diagram of the composite logic analyzer configured in accordance with my invention.

I will now describe my invention as embodied in a combined logic timing and state analyzer shown in its entirety in FIG. 1. Broadly, the illustrated composite logic analyzer comprises a first or timing analyzer section 10, a second or state analyzer section 12, a display circuit 14 for the preparation of display signals in response to the data incoming from both analyzer sections 10 and 12, and a display device such as a CRT 16 for visual presentation of the data in desired formats in response to the display signals from the display circuit.

The timing analyzer section 10 has a plurality of input terminals 18-1, 18-2, 18-3, . . . 18-n for the inputting of a first set of logic signals. Intended usually for connection to a control circuit of computer logic circuitry, the input terminals 18-1 through 18-n receive two-level digital control signals therefrom.

The input terminals 18-1 through 18-n are coupled to comparators 20-1, 20-2, 20-3, . . . 20-n, respectively, to which is also connected the output of a threshold level circuit 22. These comparators function as wave-shaping circuits, modifying the waveforms of the incoming two-level digital control signals by comparing them against the threshold voltage level determined by the threshold level circuit 22.

The outputs of the comparators 20-1 through 20-n are coupled to respective sampling circuits or samplers 24-1, 24-2, 24-3, . . . 24-n. Further connected to input a clock signal from an internal clock 26, the samplers 24-1 through 24-n obtain samples of the shaped digital control signals at a rate determined by the repetition frequency of the clock pulses put out by the internal clock 26. The repetition frequency of the output pulses from the internal clock 26 is higher than that of external clock pulses input to the state analyzer section 12, as will be referred to presently. Generally, the internal clock 26 is configured to selectively generate and put out a plurality of high-frequency clock signals.

An additional sampler 24-n+1 is connected to receive the external clock signal input to the state analyzer section 12 on one hand and, on the other hand, the clock signal from the internal clock 26. This sampler 24-n+1 samples the external clock signal at a rate determined by the internal clock signal.

The samplers 24-1 through 24-n and 24-n+1 have their outputs coupled to memories 28-1, 28-2, 28-3, . . . 28-n and 28-n+1, respectively, which are all of the random access variety. The internal clock 26 is also coupled to the control inputs of all these memories. Thus, as dictated by the output pulses from the internal clock 26, the memories 28-1 through 28-n successively store the samples of the digital control signals from the respective samplers 24-1 through 24-n. The memory 28-n+1, on the other hand, stores the samples of the external clock signal from the sampler 24-n+1 under the control of the internal clock pulses.

Shown at 30 is a trigger generator, shared by both timing analyzer section 10 and state analyzer section 12, which is connected to deliver a trigger signal to the memories 28-1 through 28-n+1 via a delay circuit 32. The trigger generator 30 puts out trigger pulses in response to the detection of system malfunctions or to manual activation at any desired time. As is well known in this technology, each trigger pulse from the trigger generator 30 works to suspend the introduction of the successive samples into the memories 28-1 through 28-n+1 and further to switch these memories from the write to the readout mode. Because of the interposition of the delay circuit 32 between the trigger generator and the memories, however, the output pulse from the trigger generator triggers the memories after a preset period of time, thereby allowing same to accept and store a preassigned number of samples incoming after the moment (trigger point) of production of the output pulse by the trigger generator. The delay circuit 32 delays the triggers by the period of time that is an integral multiple of the period of the clock pulses generated by the internal clock 26.

All the memories 28-1 through 28-n+1 have their outputs coupled to the display circuit 14. Included in this display circuit is a first control circuit, not shown in FIG. 1, which has its output line 34 connected to the control inputs of the memories 28-1 through 28-n+1. The output line 34 is intended for the transmission of a display or readout clock signal from the first control circuit to the memories. When triggered, the memories 28-1 through 28-n+1 start receiving the readout clock signal from the first control circuit, instead of the clock signal from the internal clock 26, and so is switched to the readout mode. The display circuit 14 repetitively reads out the memories 28-1 through 28-n+1.

As far as the timing analyzer section 10 is concerned, the display circuit 14 functions to produce signals for the visual presentation of the output data of the memories 28-1 through 28-n+1 in a first display format, which is a timing diagram in this particular embodiment. Receiving the output signals from the display circuit 14, the CRT 16 makes visual presentation, in the first display format, of the captured samples of the first set of logic signals and of the external clock signal. Additional functions of the display circuit 14 in conjunction with the CRT 16 will be set forth after the following description of the state analyzer section 12. The configuration of the display circuit will also be explained in detail subsequently with reference to FIG. 2.

The state analyzer section 12 of the illustrated logic analyzer has its own input terminals 36-1, 36-2, 36-3, ... 36-n, forming the second set of input terminals of the composite logic analyzer, and an additional input terminal 36-n+1. The input terminals 36-1 through 36-n are for the parallel inputting of a second set of logic signals. Usually connected to the data bus, address bus, etc., of computer logic circuitry, the input terminals 36-1 through 36-n receive two-level digital signals therefrom. The additional input terminal 36-n+1 is intended for the inputting of the external clock signal associated with the second set of logic signals. Typically, the external clock signal input terminal may be connected to a pertinent computer circuit for the reception of a reference clock signal synchronized with the varying states of the bus signals.

The second set of input terminals 36-1 through 36-n are coupled to comparators 38-1, 38-2, 38-3, ... 38-n, respectively, to which there is also connected the output of a second threshold level circuit 40. Like the first set of comparators 20-1 through 20-n the comparators 38-1 through 38-n function as wave-shaping circuits, modifying the waveforms of the incoming two-level address bus or data bus signals by comparing them against the threshold voltage level determined by the second threshold level circuit 40.

The external clock signal input terminal 36-n+1 is coupled to an additional comparator 38-n+1, which is also connected to receive the threshold voltage from the second threshold level circuit 40. Thus the additional comparator 38-n+1 also modifies the waveform of the incoming two-level external clock signal by comparison with the threshold voltage level.

The outputs of the comparators 38-1 through 38-n are coupled to samplers 42-1, 42-2, 42-3, ... 42-n, respectively, and the output of the comparator 38-n+1 is coupled to the control inputs of these samplers. Thus, at a rate determined by the repetition frequency of the shaped external clock pulses input from the comparator 38-n+1, the samplers 42-1 through 42-n sample the shaped address bus or data bus signals incoming from the comparators 38-1 through 38-n.

Additionally, the output of the comparator 38-n+1 is coupled to the sampler 24-n+1 of the timing analyzer section 10 for delivering the shaped external clock signal thereto. This sampler samples as aforesaid the incoming external clock signal at the repetition frequency of the internal clock pulses from the clock 26. It has also been stated that the recurrence rate of the internal clock pulses is higher than that of the external clock pulses.

The samplers 42-1 through 42-n of the state analyzer section 12 have their outputs coupled to memories 44-1, 44-2, 44-3, ... 44-n, respectively, of the random access type. The comparator 38-n+1 is coupled to the control inputs of all these memories 44-1 through 44-n. Under the control of the shaped external clock pulses from the comparator 38-n+1, therefore, the memories 44-1 through 44-n store the samples of the address bus or data bus signals from the respective samplers 42-1 through 42-n.

The memories 44-1 through 44-n are further connected to receive the trigger signal from the trigger generator 30 via a delay circuit 46. As has been stated in connection with the timing analyzer section 10, these memories switch from the write to the readout mode when triggered. The delay circuit 46 delays the output pulses of the trigger generator 30 by a period of time that is an integral multiple of the period of the external clock pulses being fed to the state analyzer section input terminal 36-n+1. Thus the memories 44-1 through 44-n accept and store a predetermined number of samples incoming after each trigger point.

All the memories 44-1 through 44-n have their outputs coupled to the display circuit 14. In addition to the control circuit set forth in connection with the timing analyzer section 10, the display circuit 14 includes a second control circuit which has its output line 48 connected to the control inputs of the memories 44-1 through 44-n for the delivery of a display or readout clock signal thereto. When triggered, the memories 44-1 through 44-n start taking in the readout clock signal from the second control circuit, instead of the external clock signal from the comparator 38-n+1, and thus is switched from the write to the readout mode. The display circuit 14 repetitively reads out the memories 44-1 through 44-n.

In connection with the state analyzer section 12 the display circuit 14 functions to produce signals for the visual presentation of the output data of the memories 44-1 through 44-n in a second display format, or in the form of alphanumerics in this particular embodiment. The CRT 16 responds to these outputs from the display circuit 14 to make visual presentation of the captured samples of the second logic signals in the second display format. The first and the second logic signal samples are displayed either simultaneously (as far as human visual sensation is concerned) or independently, on one and the same screen.

Figure 2:
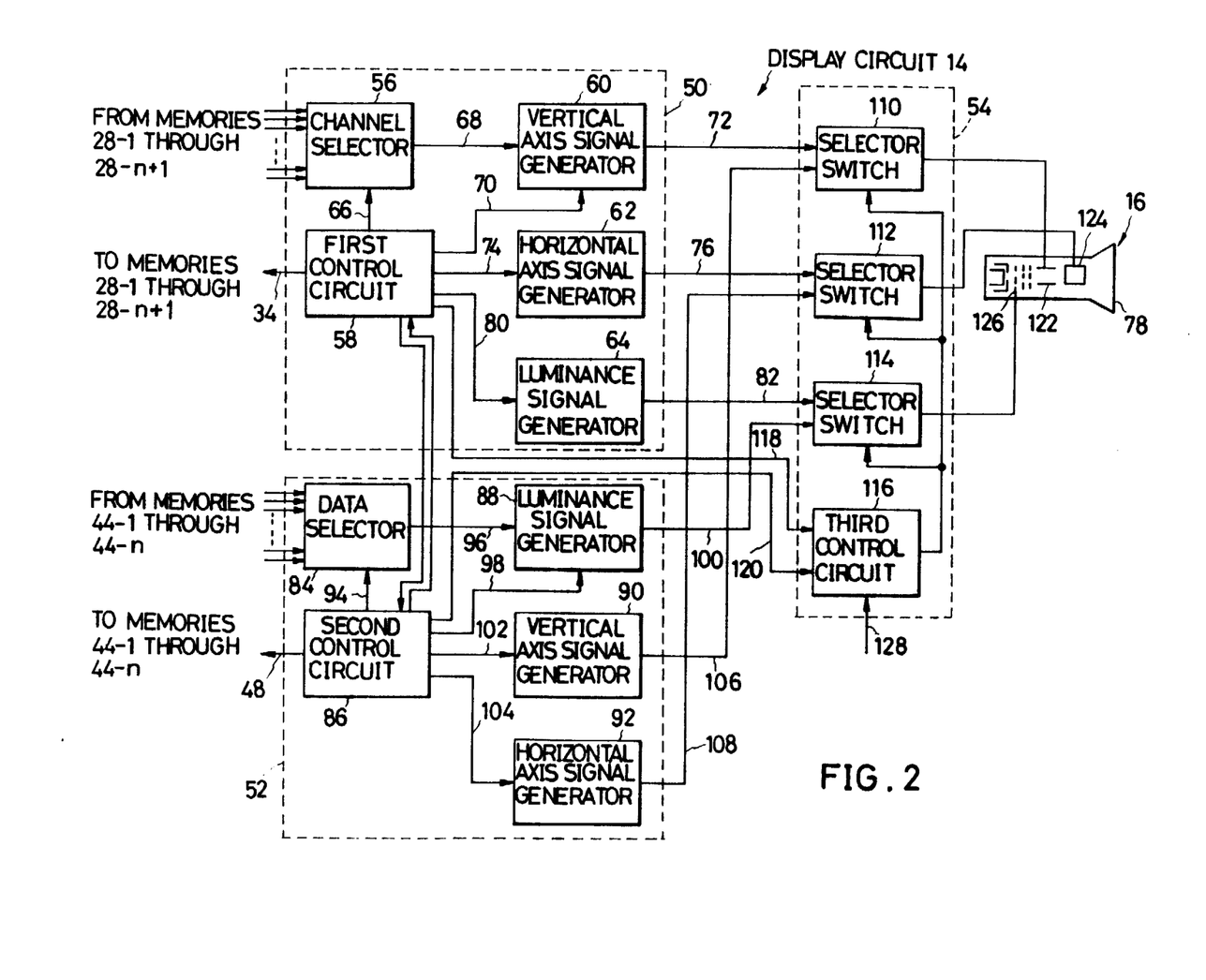
FIG. 2 is a block diagram showing in greater detail the display circuit in the logic analyzer of FIG. 1, the display circuit being shown together with a schematic representation of the display device.

FIG. 2 is a detailed representation, in block diagrammatic form, of the display circuit 14. For the convenience of description the display circuit 14 is shown subdivided into a first display signal generator circuit 50, a second display signal generator circuit 52, and a selector switch circuit 54. The following, then, is the successive discussions of these constituents 50, 52 and 54 of the display circuit 14.

The first display signal generator circuit 50 is per se conventional, having been used in the art for the production of signals necessary for data presentation on the CRT screen in the timing diagram format. It comprises a channel selector 56, the aforesaid first control circuit 58, a vertical axis signal generator circuit 60, a horizontal axis signal generator circuit 62, and a luminance signal generator circuit 64. The first control circuit 58 has its output line 34 connected to the memories 28-1 through 28-n+1 of the timing analyzer section 10.

The channel selector 56 has a plurality of data inputs connected to the respective memories 28-1 through 28-n+1 of the timing analyzer section 10, a control input connected to the first control circuit 58, and a single data output coupled to the vertical axis signal generator circuit 60. Under the control of a channel select signal supplied from the first control circuit 58 by way of a line 66, the channel selector 56 sequentially selects and puts out over a common output line 68 the output data (samples of the first logic signals) from the memories 28-1 through 28-n+1.

The vertical axis signal generator circuit 60 includes a digital-to-analog converter for translating the incoming digital data into an analog signal. This circuit 60 has another input coupled to the first control circuit 58 via a line 70 for receiving therefrom a signal identical with the channel select signal input to the channel selector 56. The vertical axis signal generator circuit 60 is equipped to convert this input signal into a staircase and to superpose each analog datum from each channel (inclusive of the external clock signal channel n+1) on one of the steps of the staircase signal. A more detailed discussion of this latter function of the vertical axis signal generator circuit 60 follows.

As is well known, the noted staircase signal represents a waveform consisting of a series of discrete steps resembling a staircase. The vertical axis signal generator circuit 60 transforms the input signal from the first control circuit 58 into the staircase voltage signal whose steps correspond to the respective channels of the timing analyzer section 10. Each analog datum from the first channel may be superposed on the first step of the staircase signal, each analog datum from the second channel on the second step of the staircase signal, and each analog datum from the last channel n+1 on the last step of the staircase signal. The composite signal thus prepared is termed a first vertical axis signal, intended for delivery to the selector switch circuit 54 by way of a line 72.

The horizontal axis signal generator circuit 62 has its input coupled to the output line 74 of the first control circuit 58 for receiving a control signal (synchronizing signal) therefrom. Generating a sawtooth voltage in accordance with the input control signal, the generator circuit 52 puts out a first horizontal axis signal, for delivery to the selector switch circuit 54 by way of a line 76. In the illustrated embodiment the CRT 16 displays the timing diagram of FIG. 3A on the left half half of its screen 78 and the state table of FIG. 3B on its right hand half. Thus the scanning period of the horizontal axis signal corresponds to approximately one of the vertically divided halves of the CRT screen 78.

Connected to the output line 80 of the first control circuit 58, the luminance signal generator circuit 64 receives a control signal (synchronizing signal) for producing, in sychronism therewith, an unblanking signal during each horizontal scanning period. The unblanking signal is also applied to the selector switch circuit 54 by way of a line 82.

The second display signal generator circuit 52 has also been known and used in the art for character display. It comprises a data selector 84, the mentioned second control circuit 86, a luminance signal generator circuit 88, a vertical axis signal generator circuit 90, and a horizontal axis signal generator circuit 92. The second control circuit 86 has its output line 48 connected to the memories 44-1 through 44-n, FIG. 1, of the state analyzer section 12.

The data selector 84 has a plurality of data inputs connected to the respective memories 44-1 through 44-n of the state analyzer section 12, a control input coupled to the second control circuit 86 via a line 94, and a single data output coupled to the luminance signal generator circuit 88 via a line 96. As the memories 44-1 through 44-n put out 16-bit data (representative for example of "0100" in hexadecimal notation) under the control of the second control circuit 86, the data selector 84 divides the 16 bits into four four-bit groups corresponding to each set of four characters for hexadecimal data presentation and sequentially delivers the bit groups to the luminance signal generator circuit 88. Such data processing by the data selector 84 also takes place under the control of the second control circuit 86.

The luminance signal generator circuit 88 is connected to the output line 96 of the data selector 84 and to the output line 98 of the second control circuit 86. Composed of an alphanumeric character generator, this circuit 88 produces a luminance signal for the display of alphanumerics representative of the incoming data. The luminance signal enters the selector switch circuit 54 by way of a line 100.

Coupled to the output line 102 of the second control circuit 86, the vertical axis signal generator circuit 90 is thereby controlled to generate, for example, an eight-step staircase voltage for each character to be displayed. The horizontal axis signal generator circuit 92 is also controlled by the second control circuit 86 via a line 104 to generate, for example, an eight-step staircase voltage for each step of the staircase voltage produced by the vertical axis signal generator circuit 90. The vertical and horizontal axis signal generator circuits 90 and 92 deliver their output signals to the selector switch circuit 54 by way of lines 106 and 108 respectively. It is possible in this manner to display each character with a combination of selected ones of 64 (8×8) notional dots. The values of the vertical axis and horizontal axis signals are to be varied for the display of successive characters in successive locations on the CRT screen 78.

Interposed between the two display signal generator circuits 50 and 52 and the CRT 16 is the selector switch circuit 54 comprising first 110, second 112 and third 114 selector switches and a third control circuit 116. The first selector switch 110 has its inputs connected to the output lines 72 and 106 of the two vertical axis signal generator circuits 60 and 90 in the first 50 and second 52 display signal generator circuits. The second selector switch 112 has its inputs coupled to the output lines 76 and 108 of the two horizontal axis signal generator circuits 62 and 92. The third selector switch 114 has its inputs coupled to the output lines 82 and 100 of the two luminance signal generator circuits 64 and 88. The third control circuit 116 has its inputs coupled to the output lines 118 and 120 of the first 58 and second 86 control circuits. The outputs of the first 110, second 112 and third 114 selector switches are coupled to the vertical deflection plates 122, horizontal deflection plates 124, and control grid 126, respectively, of the CRT 16. The output of the third control circuit 116 is coupled to the control inputs of the three selector switches 110, 112 and 114.

Figure 3A:
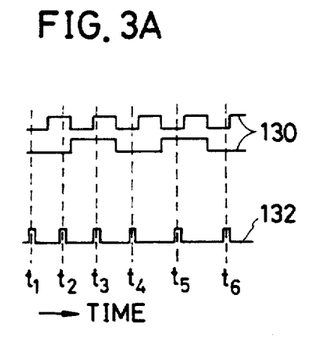
FIG. 3A is an illustration of an example of timing diagram displayed by the logic analyzer of FIG. 1.
Figure 3B:
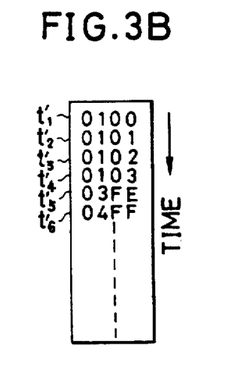
FIG. 3B is an illustration of an example of state table displayed by the logic analyzer of FIG. 1, the state table being correlated in terms of time with the timing diagram of FIG. 3A in accordance with my invention.

Functionally, the three selector switches 110, 112 and 114 permit the selective passage therethrough of the signals for the presentation of timing diagrams such as shown in FIG. 3A and the signals for the presentation of state tables such as given in FIG. 3B. The third control circuit 116 controls such operations of the selector switches.

When the selector switches 110, 112 and 114 connect the output lines 72, 76 and 82 of the first display signal generator circuit 50 to the pertinent parts of the CRT 16, the logic signal samples from the memories 28-1 through 28-n+1 of the timing analizer section 10 are displayed on the CRT screen 78 in the timing diagram format. On the other hand, when the selector switches connect the output lines 106, 108 and 100 of the second display signal generator circuit 52 to the pertinent parts of the CRT, the logic signal samples from the memories 44-1 through 44-n of the state analyzer section 12 are displayed on the CRT screen in the state table format.

The selector switch circuit 54 delivers the two sets of output signals from the first 50 and second 52 display signal generator circuits to the CRT 16 by time-division multiplex for simultaneous display of the timing diagram and the state table on its screen 78. Stated more specifically, under the control of the third control circuit 116, the three selector switches 110, 112 and 114 alternately pass both sets of signals at extremely short intervals, so short that the resulting displays give the viewer the illusion of simultaneity.

The switching operation of the selector switches 110, 112 and 114 must of course be synchronized with the timing diagram display signals and the state table display signals produced by the first 50 and second 52 display signal generator circuits. It is toward this end that the third control circuit 116 in the selector switch circuit 54 is connected to the first 58 and second 86 control circuits via the lines 118 and 120.

In some instances the display of the captured data in either the timing diagram or state table format only may be desired. For this purpose the third control circuit 116 has an external control line 128 connected thereto. On receipt of an external control signal in the form of, for example, a positive voltage through the line 128, the third control circuit 116 causes the three selector switches 110, 112 and 114 to hold the output lines 72, 76 and 82 of the first display signal generator circuit 50 connected to the CRT 16. The result is the display of only the first set of logic signals in the timing diagram format of FIG. 3A. Conversely, on application of a negative voltage to the third control circuit 116, the selector switches 110, 112 and 114 hold the output lines 100, 106 and 108 of the second display signal generator circuit 52 connected to the CRT 16. Then only the second set of logic signals will be displayed in the state table format of FIG. 3B.

In the practice of my invention a microprocessor may be employed in place of the three control circuits 58, 86 and 116 in the display circuit 14. It is also understood that this display circuit could be configured in various known or suitable forms other than the one shown in FIG. 2.

The following is the more detailed description of the operation of the combined logic timing and state analyzer shown in FIGS. 1 and 2. Such operational description presupposes that the first set of input terminals 18-1 through 18-n of the composite logic analyzer are connected to the control signal circuit of a computing system, the second set of input terminals 36-1 through 36-n to a bus coupled to the CPU of the system, and the additional input terminal 36-n+1 to the clock circuit associated with the bus.

The computer control signals fed to the input terminals 18-1 through 18-n as the first set of logic signals are of waveforms such as represented at 130 in FIG. 3A. The samplers 24-1 through 24-n sample the respective computer control signals in synchronism with the pulses input from the internal clock 26. The memories 28-1 through 28-n receive and store the successive samples of the computer control signals from the samplers 24-1 through 24-n.

The input terminals 36-1 through 36-n of the state analizer 12 receive, on the other hand, the bus signals of, for example, 16-bit information in parallel format as the second set of logic signals. The samplers 42-1 through 42-n sample the respective bus signals in step with the external clock pulses applied to the additional input terminal 36-n+1. The external clock pulses are such as shown at 132 in FIG. 3A. The memories 44-1 through 44-n receive and store the successive samples of the bus signals from the samplers 42-1 through 42-n.

Further the sampler 24-n+1 of the timing analyzer section 10 samples the external clock pulses at the higher repetition rate of the internal clock pulses. The samples of the external clock signal are stored in the memory 28-n+1.

As applied to the input terminals 18-1 through 18-n and 36-1 through 36-n+1, the computer control signals, bus signals, and external clock signal may not be of exactly two levels. The waveforms of these input signals are corrected, however, by the comparators 20-1 through 20-n and 38-1 through 38-n+1 in coaction with the threshold level circuits 22 and 40. Thus the signals of exactly two levels journey through the samplers and the subsequent stages.

Let it be assumed that the trigger generator 30 has just put out a pulse. The data introduction into the memories 28-1 through 28-n+1 of the timing analyzer section 10 will terminate when they are triggered after a preset delay by the first delay circuit 32. The data introduction into the memories 44-1 through 44-n of the state analyzer section 12 will likewise discontinue when they are triggered after another preset delay by the second delay circuit 46. In the illustrated embodiment the first delay circuit 32 delays the trigger pulse by a period of time during which each of the memories 28-1 through 28-n+1 can accept the samples to its full capacity under the control of the internal clock pulses. The second delay circuit 46 delays the trigger pulse by a period of time during which each of the memories 44-1 through 44-n can accept the samples to its full capacity under the control of the external clock pulses.

Thus, in the timing diagram of FIG. 3A displayed on the CRT screen 78, the trigger point is at the left hand end of the diagram. Also, in the hexadecimal state table of FIG. 3B exhibited on the CRT screen, the trigger point is at the top end of the table.

In the timing diagram of FIG. 3A the two-level digital waveforms 130 represent the first set of logic signals input to the timing analyzer section 10, and the lowermost waveform 132 indicates the external clock signal input to the state analyzer section 12. In the state table of FIG. 3B, on the other hand, the hexadecimal "0010", "0101", "0102", etc., represent the second set of logic signals input to the state analyzer section 12. Each set of numerals or alphanumerics of the state table corresponds in time to one of the external clock pulses.

It is thus seen that the moment t1 in the timing diagram of FIG. 3A corresponds to the moment t1' in the state table of FIG. 3B, the moment t2 to the moment t2', the moment t3 to the moment t3', etc. That is, the successive external clock pulses in the timing diagram correspond in time to the successive sets of hexadecimal characters in the state table. Consequently the viewer can readily ascertain the time relationship between the waveforms 130 of the timing diagram and the hexadecimal character sets of the state table. It will of course be seen that the illustrated embodiment is equipped to display only the waveforms and the hexadecimal character sets, the various other indicia given in FIGS. 3A and 3B being intended to facilitate the understanding of my invention.

As an additional advantage of my invention the timing analyzer section 10 of the composite logic analyzer is conditioned for high speed operation, and its state analyzer section 12 for low speed operation. This circuit configuration affords a substantial reduction in the cost of the complete instrument as compared with the costs of conventional logic state and timing analyzers processing all input signals at high speed.

Figure 4:
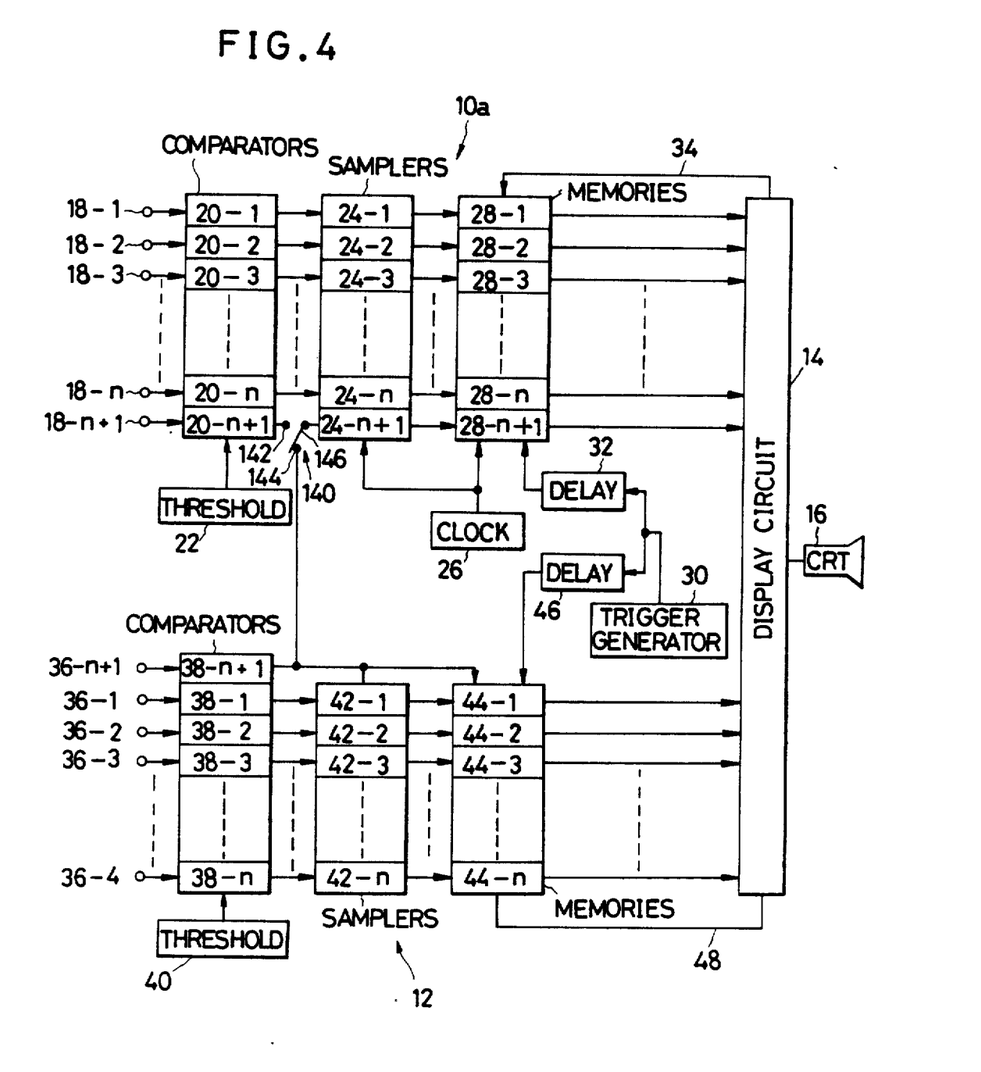
FIG. 4 is a block diagram of a second form of the composite logic analyzer in accordance with my invention.

FIG. 4 shows another preferable embodiment of my invention, which includes a timing analyzer section 10a of slightly different configuration from that of the preceding embodiment. The state analyzer section 12 of this second embodiment is identical with that of the first.

The modified timing analyzer section 10a has an input terminal 18-n+1, in addition to the n input terminals 18-1 through 18-n of the preceding embodiment. The additional input terminal 18-n+1 is coupled to an additional comparator 20-n+1, which has another input coupled to the threshold level circuit 22, as do all the other comparators 20-1 through 20-n. Shown at 140 is a selector switch comprising a first fixed contact 142 connected to the comparator 20-n+1, a second fixed contact 144 connected to the comparator 38-n+1 of the state analyzer section 12, and a movable contact 146 connected to the sampler 24-n+1. The other details of construction are exactly as set forth above in connection with the first embodiment.

In FIG. 4 the movable contact 146 of the selector switch 140 is shown engaged with the second fixed contact 144 to connect the comparator 38-n+1 of the state analyzer section 12 to the sampler 24-n+1. In this condition the composite logic analyzer functions just like the one of FIG. 1, displaying the external clock pulses on the CRT screen along with the first set of logic signals.

If the display of the external clock signal is not desired, the movable contact 146 of the selector switch 140 may be actuated into engagement with the first fixed contact 142 thereby connecting the input terminal 18-n+1 of the timing analyzer section 10a to the sampler 24-n+1 via the comparator 20-n+1. The analyzer no longer displays the external clock signal but does exhibit, instead, an additional logic signal input to the timing analyzer section 10a as one of the first set of logic signals. Thus the sampler 24-n+1 and memory 28-n+1 can be utilized for processing a desired one of the external clock signal and the additional one of the first set of logic signals.

Figure 5:
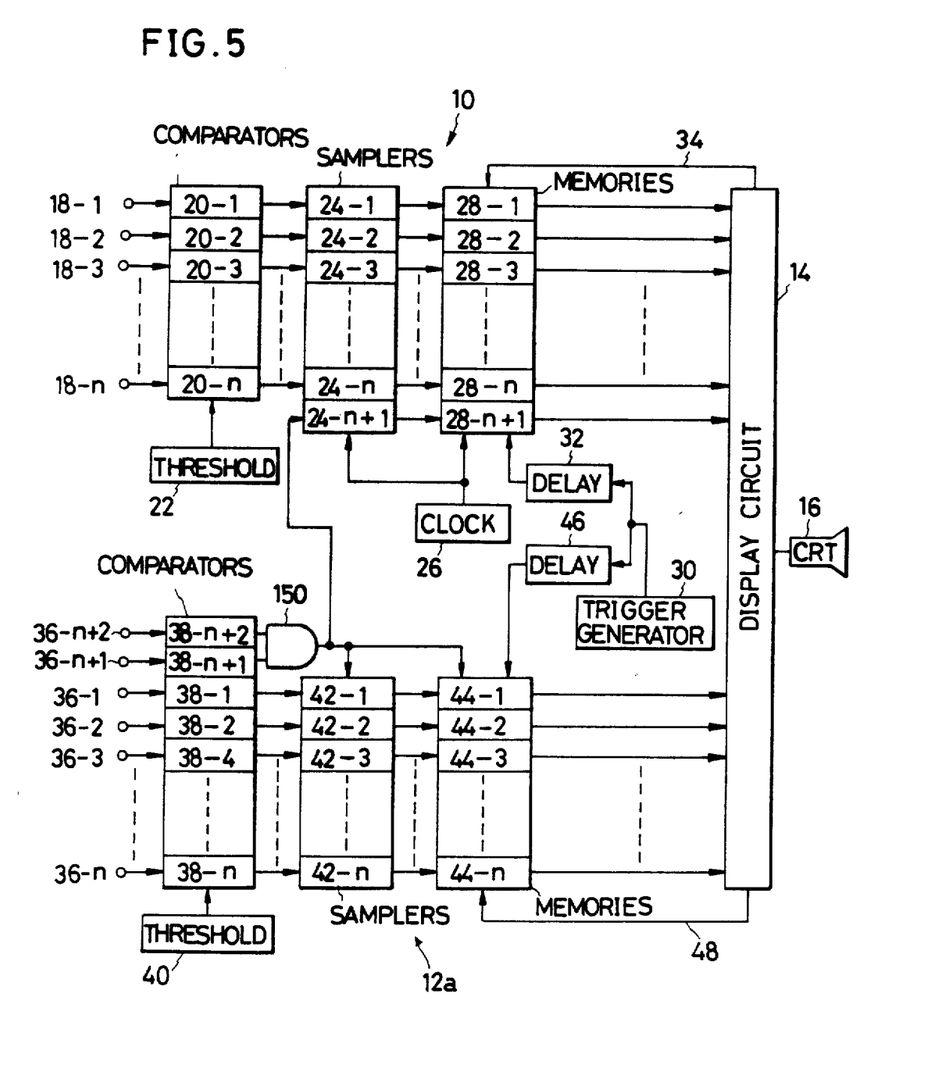
FIG. 5 is also a block diagram of a third form of the composite logic analyzer in accordance with my invention.

Still another preferable embodiment shown in FIG. 5 has a modified state analyzer section 12a, the timing analyzer section 10 of this embodiment being identical with that shown in FIG. 1. The modified state analyzer section 12a features a clock qualifier input terminal 36-n+2. This input terminal is coupled to a comparator 38-n+2, which is further connected to receive the threshold voltage signal from the threshold level circuit 40, as are all the other comparators of the state analyzer section 12a. The comparator 38-n+2 is coupled to one of the two inputs of an AND gate 150, the other input of which is connected to the comparator 38-n+1, associated with the external clock signal input terminal 36-n+1. The output of the AND gate 150 is coupled to the samplers 42-1 through 42-n and memories 44-1 through 44-n of the state analyzer section 12a and to the sampler 24-n+1 of the timing analyzer section 10. The other details of construction are similar to those set forth in connection with FIG. 1 or 4.

In the modified state analyzer section 12a the input terminal 36-n+1 is intended to receive the clock pulses associated with the address bus signals and the clock pulses associated with the data bus signals, both by way of example only, as such clock pulses are supplied in time-division multiplex. The input terminal 36-n+2 is for the reception of a clock qualifier signal synchronized with the data bus clock signal. Thus the AND gate 150 puts out pulses corresponding only to the data bus clock pulses, for delivery to the sampler 24-n+1 of the timing analyzer section 10, as well as to all the samplers and memories of the state analyzer section 12a. The CRT displays, therefore, only the desired one of the external clock signals.

Figure 6:
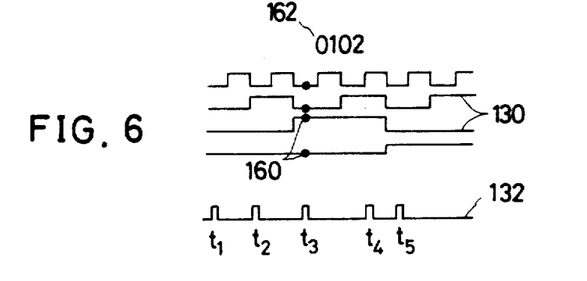
FIG. 6 is an illustration of another example of composite display mode in accordance with my invention.

FIG. 6 is explanatory of a display mode alternative to that of FIGS. 3A and 3B. According to this alternative mode the CRT displays the first set of logic signals and the external clock signal as at 130 and 132, respectively, but not all the captured data on the second set of logic signals at one time. It will be noted that black dots 160 are shown superposed on the waveforms 130 at the moment t3 in time. In practice the black dots may take the form of bright spots formed by luminance modulation. As such bright spots are made to appear superposed on the waveforms of the first set of logic signals at any desired moment, a hexadecimal set of characters representative of the second set of logic signals (bus signals) at that moment is to be displayed atop the waveforms, as indicated at 162 by way of example. The time relationship between the first and the second sets of logic signals can thus be visually ascertained at any desired moment.

For such an alternative display mode a microprocessor (not shown) may be built into the instrument of FIGS. 1 and 2. Under the control of this microprocessor the data selector 84 of FIG. 2 may be caused to select and put out the samples of the second set of logic signals at each desired moment.

Figure 7:
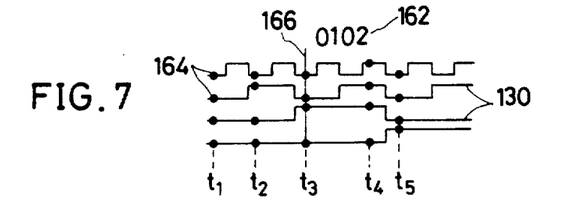
FIG. 7 is an illustration of still another example of composite display mode in accordance with my invention.

FIG. 7 is an illustration of another different display mode in accordance with my invention, which also requires the use of a microprocessor in the display circuit 14 of FIG. 2. According to this additional display mode the CRT displays the waveforms 130 of the first set of logic signals, as in the foregoing display modes, but not the waveform of the external clock signal. Instead, the logic signal waveforms 130 are luminance modulated to carry bright spots 164 at successive moments t1, t2, t3, etc., corresponding to the external clock pulses. These bright spots represent the external clock pulses, as does the waveform 132 of FIGS. 3A and 6.

Seen at 166 in FIG. 7 is a marker in the form of a bright, vertical line to be exhibited on the CRT screen. As the viewer shifts and adjusts the marker line 166 to any of the vertical rows of bright spots 164 such as, for example, those at the moment t3 as shown, a hexadecimal set of characters 162 representative of the second set of logic signals at that moment is displayed over the waveforms 130, as in the display mode of FIG. 6.

Figure 8:
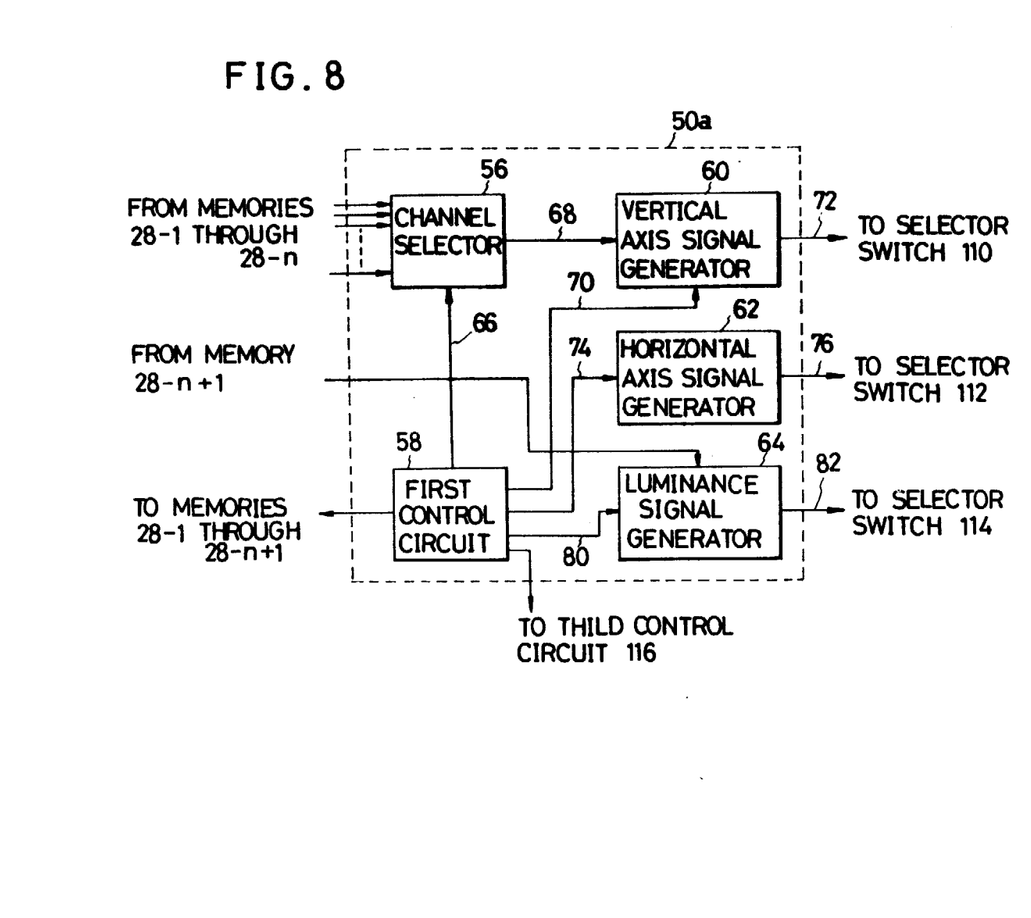
FIG. 8 is a block diagram of a modified first display signal generator circuit, for use in the display circuit of FIG. 2, for obtaining the display mode of FIG. 7.

For the display of the external clock pulses in the form of the bright spots 164 there may be employed a circuit 50a of FIG. 8. This circuit is a modification of the first display signal generator circuit 50 of FIG. 2 and is to make up the display circuit 14 in combination with the second display signal generator circuit 52 and the selector switch circuit 54. The modified display signal generator circuit 50a does not include means for the display of the marker 166.

The modified display signal generator circuit 50a differs from the original circuit 50 in that the output of the external clock memory 28-n+1 is not coupled to the channel selector 56 but to the luminance signal generator 64. This circuit 64 effects luminance modulation at the moments of the incoming external clock pulses so as to create the bright spots 164 superposed on the waveforms 130 of the first set of logic signals.

Although I have shown and described my invention in terms of some preferable embodiments and modifications thereof, I understand that they are by way of example only and are not intended to impose limitations on the invention, since additional modifications and variations will readily occur to one skilled in the art. For example, if the composite logic analyzer according to my invention is to be used with signals of exactly two-level, well-defined waveforms, the comparators 20-1 through 20-n and 38-1 through 38-n+1 and the threshold level circuits 22 and 40 may be omitted. The omission of the delay circuits 32 and 46 is also possible if data introduction into the memories 28-1 through 28-n+1 and 44-1 through 44-n is to be suspended immediately upon production of a trigger pulse by the trigger generator 30.

Further, if desired, an additional input terminal or terminals may be provided for the reception of a correspondingly increased number of external clock signals, which are to be put to selective use for the purposes set forth above. Still further, in the illustrated embodiment, the display or readout clock signals are generated in the display circuit 14 and applied therefrom to the memories 28-1 through 28-n+1 and 44-1 through 44-n. As required or desired, however, independent circuits may be employed for such clocking.

All these and other modifications or variations are intended in the foregoing disclosure. My invention is therefore not to be limited except as specifically set forth in the following claims.

What I claim is:

1. A composite logic analyzer capable of displaying a first and a second set of data in different, time-related formats, comprising:
   (a) first input means for receiving a first set of logic signals;
   (b) second input means for receiving a second set of logic signals;
   (c) additional input means for receiving an external clock signal associated with the second set of logic signals;
   (d) an internal clock for generating an internal clock signal having a repetition frequency higher than that of the external clock signal;
   (e) first sampler means coupled to the first input means for sampling the first set of logic signals at a rate determined by the internal clock signal;
   (f) second sampler means coupled to the second input means for sampling the second set of logic signals at a rate determined by the external clock signal;
   (g) additional sampler means coupled to the additional input means for sampling the external clock signal at a rate determined by the internal clock signal;
   (h) first memory means coupled to the first sampler means for storing the samples of the first set of logic signals under the control of the internal clock signal;
   (i) second memory means coupled to the second sampler means for storing the samples of the second set of logic signals under the control of the external clock signal;
   (j) additional memory means coupled to the additional sampler means for storing the samples of the external clock signal under the control of the internal clock signal;
   (k) trigger means coupled to the first, the second and the additional memory means for triggering same and hence for suspending the introduction of the samples therein;
   (l) a display circuit coupled to the first, the second and the additional memory means for producing a first set of display signals for displaying in a first format the data recovered from the first and the additional memory means, and for producing a second set of display signals for displaying in a second format the data recovered from the second memory means; and
   (m) a display device coupled to the display circuit for making visual presentation of the output data in response to the first and the second sets of display signals.

2. The composite logic analyzer as recited in claim 1, wherein:
   (a) the first set of logic signals are control signals from computer logic circuitry;
   (b) the second set of logic signals are bus signals from the computer logic circuitry; and
   (c) the external clock signal is a clock signal for the bus signals.

3. The composite logic analyzer as recited in claim 1, wherein the display circuit comprises:
   (a) a first display signal generator circuit coupled to the first and the additional memory means for producing vertical axis, horizontal axis, and luminance signals as the first set of display signals;
   (b) a second display signal generator circuit coupled to the second memory means for producing vertical axis, horizontal axis, and luminance signals as the second set of display signals; and
   (c) a selector switch circuit connected between the first and second display signal generator circuits and the display device for permitting the selective passage therethrough of the first and the second sets of display signals.

4. The composite logic analyzer as recited in claims 1 or 3, wherein:
   (a) the first set of display signals are for displaying the data in the form of a timing diagram; and
   (b) the second set of display signals are for displaying the data in the form of characters.

5. The composite logic analyzer as recited in claim 1, further comprising:
   (a) first wave-shaping means connected between the first input means and the first sampler means for shaping the waveforms of the first set of logic signals;

(b) second wave-shaping means connected between the second input means and the second sampler means for shaping the waveforms of the second set of logic signals; and (c) additional wave-shaping means connected between the additional input means and the additional sampler means for shaping the waveform of the external clock signal.

6. The composite logic analyzer as recited in claim 1, wherein the trigger means comprises:

(a) a first trigger generator;

(b) a first delay circuit connected between the trigger generator and the first and additional memory means; and (c) a second delay circuit connected between the trigger generator and the second memory means.

7. The composite logic analyzer as recited in claim 1, further comprising:

(a) second additional input means for receiving another first logic signal; and (b) a selector switch for selectively connecting the first recited and the second additional input means to the additional sampler means.

8. The composite logic analyzer as recited in claim 1, wherein the additional input means receives a plurality of external clock signals, and wherein the analyzer further comprises:

(a) second additional input means for receiving a clock qualifier signal synchronized with a preselected one of the external clock signals; and (b) an AND gate having inputs coupled to the first recited and the second additional input means and having an output coupled to the second and the additional sampler means and the second memory means.

9. The composite logic analyzer as recited in claim 3, wherein the first display signal generator circuit comprises:

(a) a vertical axis signal generator circuit coupled to the first memory means for generating a vertical axis signal in response to the output data therefrom;

(b) a horizontal axis signal generator circuit for generating a horizontal axis signal in the form of a sawtooth voltage synchronized with the vertical axis signal; and (c) a luminance signal generator circuit for generating an unblanking signal during the horizontal scanning periods of the horizontal axis signal, the luminance signal generator circuit being further coupled to the additional memory means for effecting luminance modulation in response to the output therefrom.

* * * * *